United States Patent [19]

Berdan et al.

[11] 4,234,395
[45] Nov. 18, 1980

[54] METAL COMPOSITES AND LAMINATES FORMED THEREFROM

[75] Inventors: Betty L. Berdan, Willowick; William M. King, Mentor, both of Ohio

[73] Assignee: Gould Inc., Rolling Meadows, Ill.

[21] Appl. No.: 952,512

[22] Filed: Oct. 18, 1978

Related U.S. Application Data

[63] Continuation of Ser. No. 652,139, Jan. 26, 1976, abandoned, which is a continuation-in-part of Ser. No. 431,060, Jan. 7, 1974, abandoned.

[51] Int. Cl.³ .......................... C25D 1/04; C25D 5/44
[52] U.S. Cl. ........................................ 204/12; 204/33; 204/40
[58] Field of Search .................... 204/33, 52 R, 52 Y, 204/12, 13, 385, 40

[56] References Cited

U.S. PATENT DOCUMENTS

| | | | |
|---|---|---|---|
| 2,871,171 | 1/1959 | Atkinson | 204/33 |
| 3,775,265 | 11/1973 | Bharucha et al. | 204/33 |
| 3,857,681 | 12/1974 | Yates et al. | 204/40 X |
| 3,998,601 | 12/1976 | Yates et al. | 29/195 |

FOREIGN PATENT DOCUMENTS

1293801 10/1972 United Kingdom .

OTHER PUBLICATIONS

Metal Finishing Guidebook and Directory, 1975, Metals and Plastics Publications, Inc., Hackensack, N.J., p. 144.
Alloy Digest, Aluminum 1100 Filing Code:Al-44, Oct. 1956, Published by Engineering Alloys Digest, Inc., Upper Montclair, New Jersey.

Primary Examiner—John H. Mack
Assistant Examiner—William Leader
Attorney, Agent, or Firm—Edward E. Sachs; Russell E. Baumann

[57] ABSTRACT

A metal composite comprising a substrate having a uniformly, mildly etched surface of an aluminum alloy, e.g. an alloy, consisting of at least about 99 wt. % aluminum, and the balance comprising specified quantities of silicon, iron, copper, manganese and zinc, and a uniformly adhering, electrocathodically deposited copper foil. The resulting peel strength between the aluminum alloy surface and the copper foil, after lamination of the composite to a resinous substrate under heat and pressure is within the range of from about 6 to about 8 lbs./in. of width of copper foil. This can be reduced to a value within the range of about 0.3 to about 2 lbs./in. of width by overplating the copper foil with a layer of zinc or indium. The resinous substrate may be a glass fiber reinforced epoxy resin, such as is used in the manufacture of printed circuit boards.

2 Claims, 12 Drawing Figures

METAL COMPOSITES AND LAMINATES FORMED THEREFROM

This is a continuation of application Ser. No. 652,139, filed Jan. 26, 1976, now abandoned, which is a continuation-in-part of application, Serial No. 431,060, filed Jan. 7, 1974 now abandoned.

The present invention relates to the art of metal composites and to the formation of laminates therewith.

In more specific terms, the invention relates to improvements in metal composites comprising a substrate having an aluminum alloy surface, upon which has been deposited electrocathodically, an ultra-thin foil of copper. Such metal composites are useful in the manufacture of printed circuit boards, wherein the copper foil facing of the composite is laminated against a suitable nonconducting support, for example, a glass fiber reinforced epoxy resin. After a bond between the copper foil and support has been effected, either by applying the foil to an uncured or partially cured resin surface, or by applying it to a cured resin surface using an adhesive interface, the aluminum alloy substrate is removed, leaving the copper foil laminated to the nonconducting support.

Depending upon the strength of the adhesion between the aluminum alloy substrate and the copper foil, the former may be removed either by peeling it off, or by chemical means, for example, etching.

Although the invention will be described with reference to its utilization in the manufacture of printed circuit boards, it will be understood that this is for illustrative purposes only, and is not to be construed as a limitation on the scope of applicability of the invention.

BACKGROUND OF THE INVENTION

Japanese patent application Ser. No. 87053/1972, filed Aug. 29, 1972, and published May 24, 1973, under No. 35357/1973, describes a method of manufacturing material for printed circuits, wherein an ultra-thin layer of copper is deposited upon a suitable temporary carrier such as a substrate of aluminum, zinc or steel.

The copper foil, which may have a thickness of 17 microns and less, is then laminated with an insulating support such as a glass fiber reinforced epoxy resin. Thereafter, the temporary carrier is removed, either by mechanically peeling the same off, or chemically, by etching it off, leaving a copper foil surface on an insulating support. The copper foil may then be etched or otherwise treated to produce an electrical circuit.

The use of ultra-thin copper foil in the manufacture of printed circuit boards provides some distinct advantages over the use of conventional "one ounce" copper foil, i.e. copper foil weighing one ounce per square foot, and measuring about 1.4 mils thick. For example, since the ultra-thin foil is on the order of only 1/6 to 1/7 as thick as one ounce copper foil, there is an initial and substantial saving in the quantity of copper employed. Moreover, since less copper is removed during etching, copper recovery costs are similarly reduced, or alternatively, copper losses are reduced if no such recovery is effected.

Further, the problem of undercutting of retained copper by the etchant during printed circuit formation, which is a significant problem when using one ounce copper foils and thicker, is minimized with the use of ultra-thin copper foils. This is due to the fact that the severity of undercutting decreases as the thickness of the copper foil decreases.

The above mentioned Japanese application indicates that some difficulty has been experienced in obtaining good adhesion between an aluminum temporary substrate and electrocathodically deposited copper. The disclosure goes on to state that in order to obtain good adhesion, it is essential to use a cyanide electroplating bath, and that even when such a bath is employed, the plated product tends to deteriorate with time. The Japanese disclosure also makes note of the hazardous nature of cyanide plating solutions.

As a solution to these problems, the Japanese disclosure states that the aluminum substrate may be coated with a thin layer of zinc or tin prior to depositing an electroplate of copper.

It is also known, in accordance with the prior art, to apply a thin layer of zinc, indium, or brass to a copper foil prior to laminating the foil to a suitable support to prevent migration of nodules of copper or copper oxide on the surface of the foil to the interior of the support. As described in British Pat. No. 1,293,801, the application of such a barrier layer solves the migration problem with no loss of peel strength.

Finally, it is known according to U.S. Pat. No. 2,856,333 to etch aluminum alloys with HCl fumes to provide a surface to which a copper electroplate will strongly bond.

SUMMARY OF THE INVENTION

We have found, in accordance with the present invention, that a uniformly adherent electroplate of copper can be obtained directly on a substrate having a mildly, uniformly etched aluminum alloy surface. Alloys capable of undergoing uniform etching under mild etching conditions comprise at least about 99 wt.% aluminum, with the balance comprising up to about 1.00 Wt.% silicon plus iron; from about 0.05 to about 0.20 wt.% copper; up to about 0.05 wt.% manganese; and up to about 0.10 wt.% zinc. The peel strength between the copper foil and the aluminum substrate after lamination of the exposed face of the foil to a resinous support under heat and pressure is within the range of about 6 to about 8 lbs./in. For purposes of this disclosure, the peel strength is a measurement in terms of force in pounds required to separate a one inch wide strip of copper foil from the substrate when pulled at an angle of 90° to the surface.

Attempts to plate copper on aluminum surfaces which have not been etched, result in discontinuous or blistered plates. Peel strength developed under these conditions are erratic at best, and meaningless at worst. Values will range from zero, in areas where the copper plate has blistered or failed to deposit, to some positive value, in areas where adhesion has taken place between the copper plate and the aluminum surface. All that can be read is an average value, which is not meaningful because it does not represent a property of a uniformly adherent copper plate.

Attempts to plate copper on aluminum surfaces which have been non-uniformly etched result in high peel strength values, in excess of 14 lbs./in. of width of copper foil. Actually, what happens under these conditions is that the copper separates from the resinous surface rather than from the aluminum. This indicates that the bond between the copper and aluminum is stronger than the bond between the copper and the resin. We theorize that the strong bond between the copper and aluminum is due to the physical locking of the copper to craters etched in the aluminum surface.

We have also found that aluminum alloys containing from about 96.7 wt.% aluminum to in excess of 99.4 wt.% aluminum do not promote strong, uniformly adherent bonds with copper plate deposits, but rather produce blistering, pin holes and other defects. Such results have been interpreted to mean that the alloys employed do not undergo uniform etching under mild etching conditions.

Recognizing that peel strengths in the range of about 1 to about 2 lbs./in. are about as high as can be overcome by hand, it will be understood that peel strengths in the range of about 6 to about 8 lbs./in. necessarily have to be overcome by other means, such as by mechanical pulling means or etching means. Since in some circumstances it may be desirable to be able to remove the temporary aluminum alloy substrate by hand rather than restoring to etching or other means, we have developed, in accordance with another aspect of the present invention, a system for reducing the magnitude of peel strength without adversely affecting the uniformity of coverage and adhesion of the copper plate on the aluminum alloy.

In accordance with this further aspect of the invention, after the copper foil has been deposited on the aluminum alloy substrate, the exposed surface of the copper foil is overplated with a material selected from the group consisting of zinc and indium to a thickness within the range of about 10 to about 25 microinches. When the overplated copper foil is laminated to a support, such as a glass fiber reinforced resin, it has been found that the peel strength between the copper foil and the aluminum alloy substrate is reduced from the range of 6 to 8 lbs./in. to the range of 0.3 to 1.5 lbs./in. This permits the aluminum alloy substrate to be peeled away by hand.

It is therefore an object of the present invention to provide an improved metal composite comprising a uniformly electrocathodically deposited copper plate on a mildly, uniformly etched aluminum alloy.

A further object of the invention is to provide a metal composite comprising a plate of copper foil uniformly adhered to a mildly, uniformly etched aluminum alloy substrate, and bonded with a peel strength within the range of about 6 to about 8 lbs./in. of width of copper foil.

Yet another object of the invention is to provide a metal composite comprising a plate of copper foil uniformly adhered to a mildly, uniformly etched aluminum alloy substrate, and bonded with a peel strength within the range of about 0.3 to about 1.5 lbs./in. of width of copper foil.

A still further object of this invention is to provide improved laminates in which the above described metal composites are bonded to a support.

Another object of the invention is to provide a method of forming improved metal composites and laminates therefrom.

Other objects and advantages of the present invention will become apparent from the following detailed description thereof which includes the best mode presently contemplated for practicing the invention.

DESCRIPTION OF THE PREFERRED EMBODIMENT

Alumimum alloys useful in the practice of the present invention are those capable of undergoing uniform etching under mild etching conditions. Suitable alloys include those containing at least about 99 wt.% aluminum, the balance comprising up to about 1.00 wt.% silicon plus iron, from about 0.05 to about 0.20 wt.% copper, up to about 0.05 wt.% manganese, and up to about 0.10 wt.% zinc.

Compositions falling within these limits are commercially available under the trade designation aluminum alloy 1100. This alloy is available in a number of tempers including −0, −H111, −H27 and −H19. The −H19 temper provides the highest ultimate strength and is therefore preferred where the alloy is subjected to stresses, for example, in a continuous line operation. Where the alloy is treated on a batch basis, lower tempers may be employed. The minimum thickness of the alloy should be at least about 1 mil and preferably at least about 1.5 to 2 mils.

The aluminum alloy is pretreated by uniformly etching it with a suitable alkaline etchant, under mild etching conditions. Useful etchants include sodium carbonate, sodium hydroxide, potassium carbonate, potassium hydroxide, lithium hydroxide, rubidium hydroxide, and mixtures of potassium carbonate or sodium carbonate with trisodium phosphate. Of these, sodium hydroxide is preferred. In general, concentrations on the order of about 2% and room temperature exposure times of about two minutes will provide a mild etching environment. After being rinsed with water, the etched aluminum alloy is then preferably desmutted by contact with a suitable acidic medium, such as 30 vol.% nitric acid or 10 vol.% sulfuric acid for about two minutes at room temperature, and thereafter rinsed.

A preferred etching system, which produces a uniformly etched surface, is described in U.S. Pat. No. 3,898,095. Reference may be made to this patent for a full disclosure of suitable etchant and desmutting compositions and treating conditions which may be used in the practice of this step.

Figure 1:
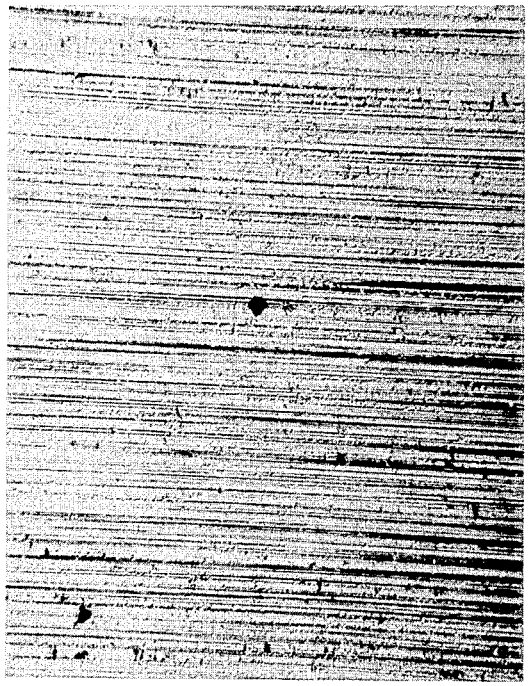
FIG. 1 is a photomicrograph of an aluminum alloy surface prior to etching.
Figure 2:
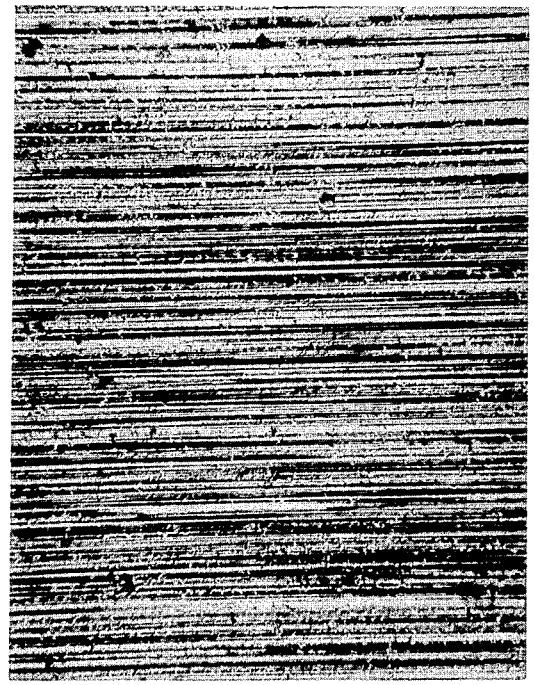
FIG. 2 is a photomicrograph of an aluminum alloy surface after mild, uniform etching in accordance with the teachings of the present invention.
Figure 4:
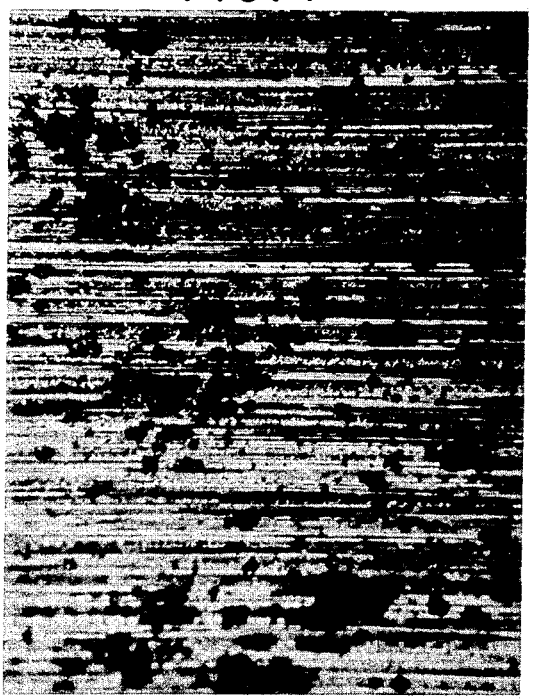
FIG. 4 is a photomicrograph of an aluminum alloy surface etched with HCl fumes generated by hydrochloric acid heated to 140° F.
Figure 3:
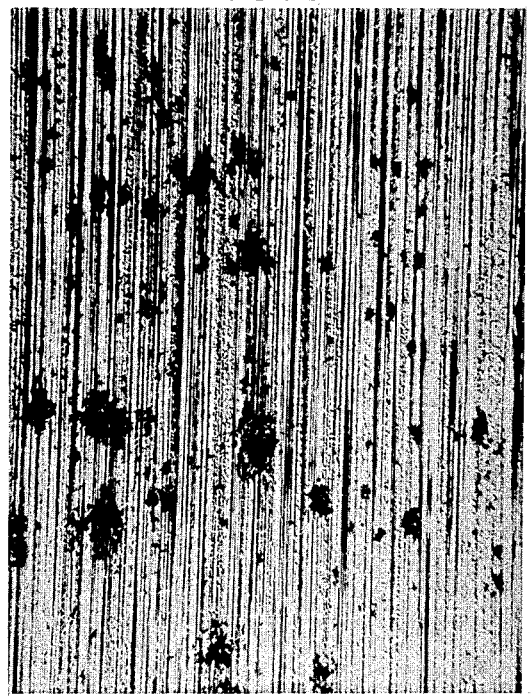
FIG. 3 is a photomicrograph of an aluminum alloy surface etched with HCl fumes at room temperature.
Figure 5:
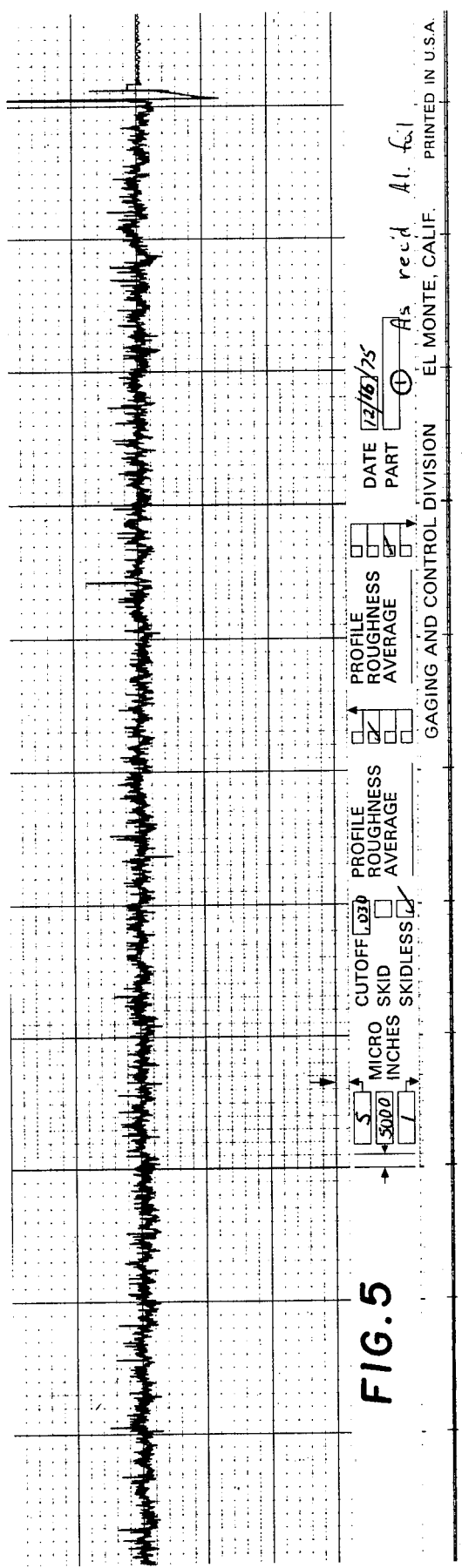
FIG. 5 is a photograph of the printout of a single probe surface analyzer, depicting the roughness of the aluminum alloy surface illustrated in FIG. 1, as the arithmetical average deviation expressed in microinches, measured normal to the center line.
Figure 6:
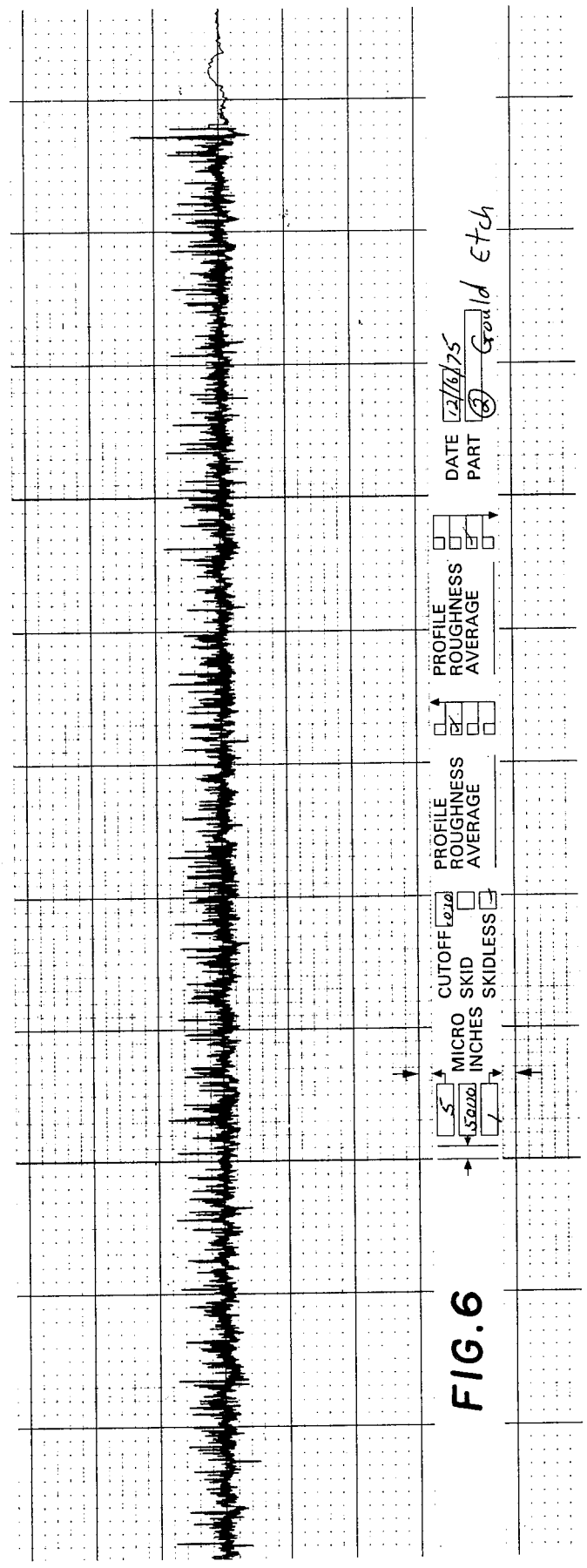
FIG. 6 is a photograph of the printout of a single probe surface analyzer, depicting the roughness of the aluminum alloy surface illustrated in FIG. 2, as the arithmetical average deviation expressed in microinches, measured normal to the center line.
Figure 7:
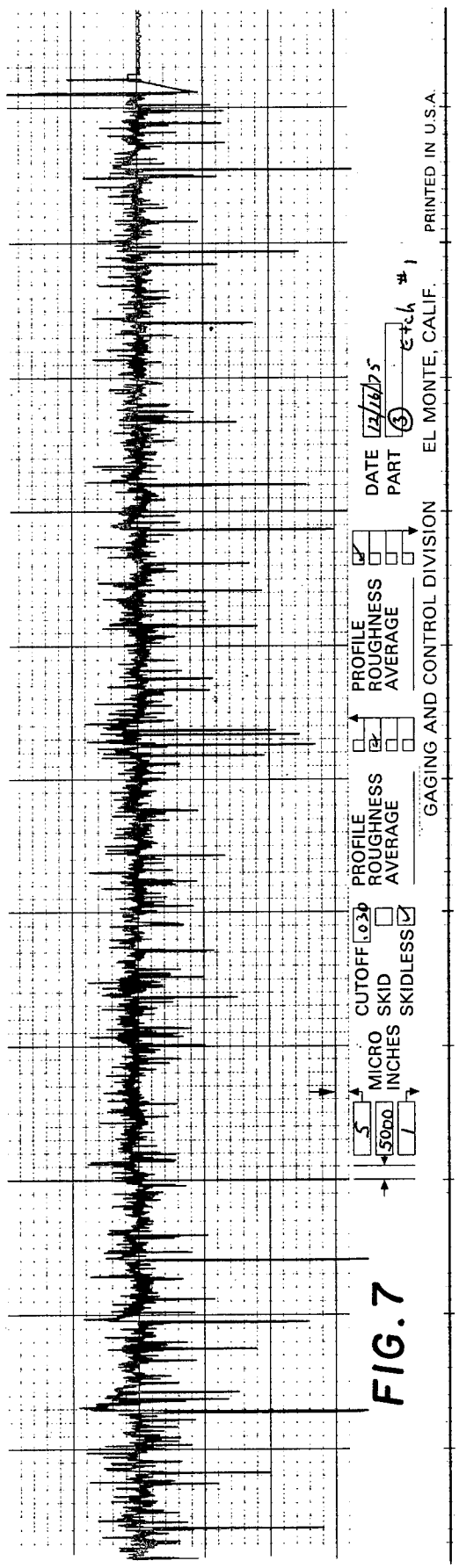
FIG. 7 is a photograph of the printout of a single probe surface analyzer, depicting the roughness of the aluminum alloy surface illustrated in FIG. 3, as the arithmetical average deviation expressed in microinches, measured normal to the center line.
Figure 8:
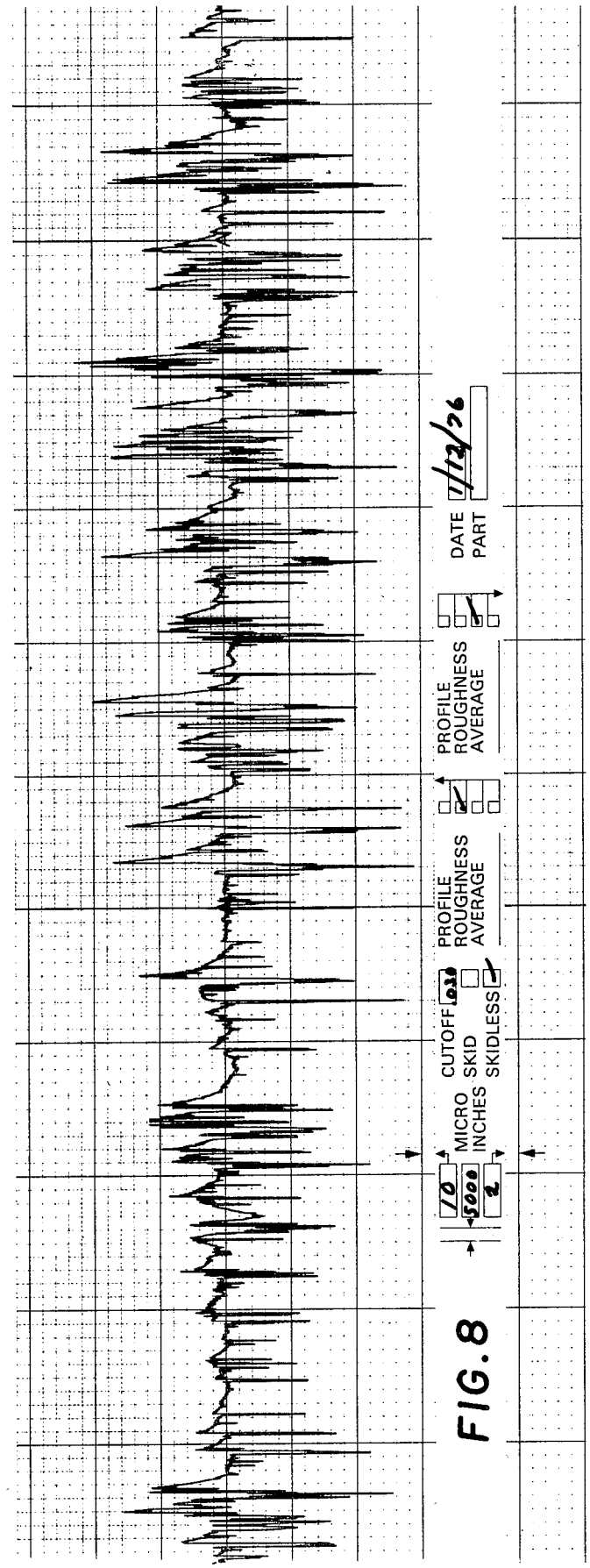
FIG. 8 is a photograph of the printout of a single probe surface analyzer, depicting the roughness of the aluminum alloy surface illustrated in FIG. 4, as the arithmetical average deviation expressed in microinches, measured normal to the center line.

The physical effect of mild, uniform etching on an aluminum alloy surface can best be seen by comparing FIGS. 1 and 2; FIGS. 5 and 6; and FIGS. 9 and 10. The aluminum alloy (1100) surface represented by FIGS. 1, 5 and 9 is in the "as received" condition, while the surface represented by FIGS. 2, 6 and 10 is one which has been mildly, uniformly etched in accordance with the present invention.

The 100 magnification microphotographs, FIGS. 1, 2 show little visual change in the condition of the surface of the aluminum alloy (considering the absence of visible change, it is surprising that the "as is" aluminum supports a blistered copper plate while the mild, uniformly etched surface supports a uniformly adherent copper plate).

Comparing FIGS. 5, 6, the roughness of the mildly etched surface has increased (from about 1 micron, arithmetic average to about 2 microns, arithmetic average), but in terms of uniformity, the etched and "as is" surfaces are markedly similar.

Figure 9:
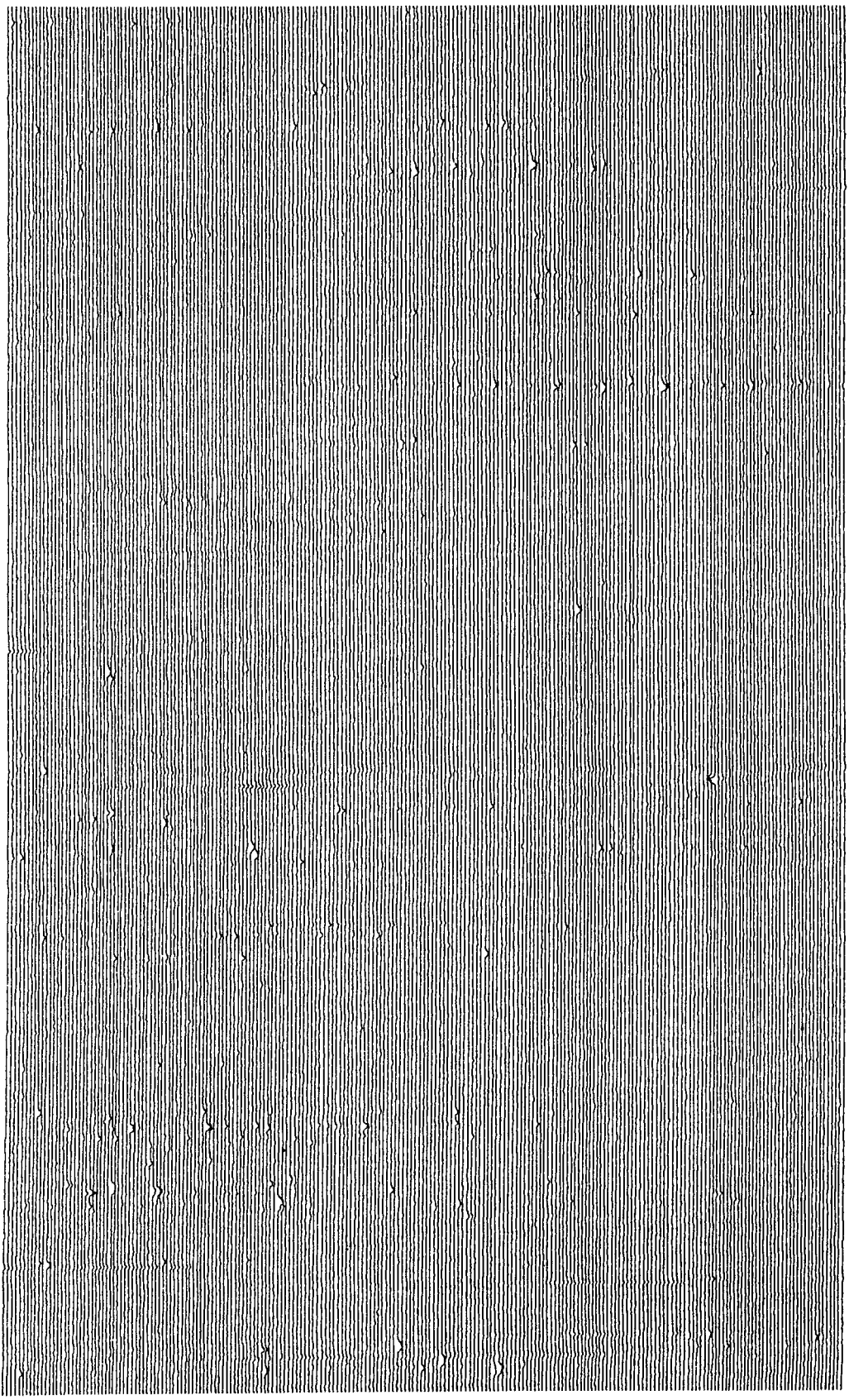
FIG. 9 is a photograph of a printout of a surface analyzer with a horizontally displaceable probe depicting the roughness of the aluminum alloy surface illustrated in FIG. 1, expressed in microinches.
Figure 10:
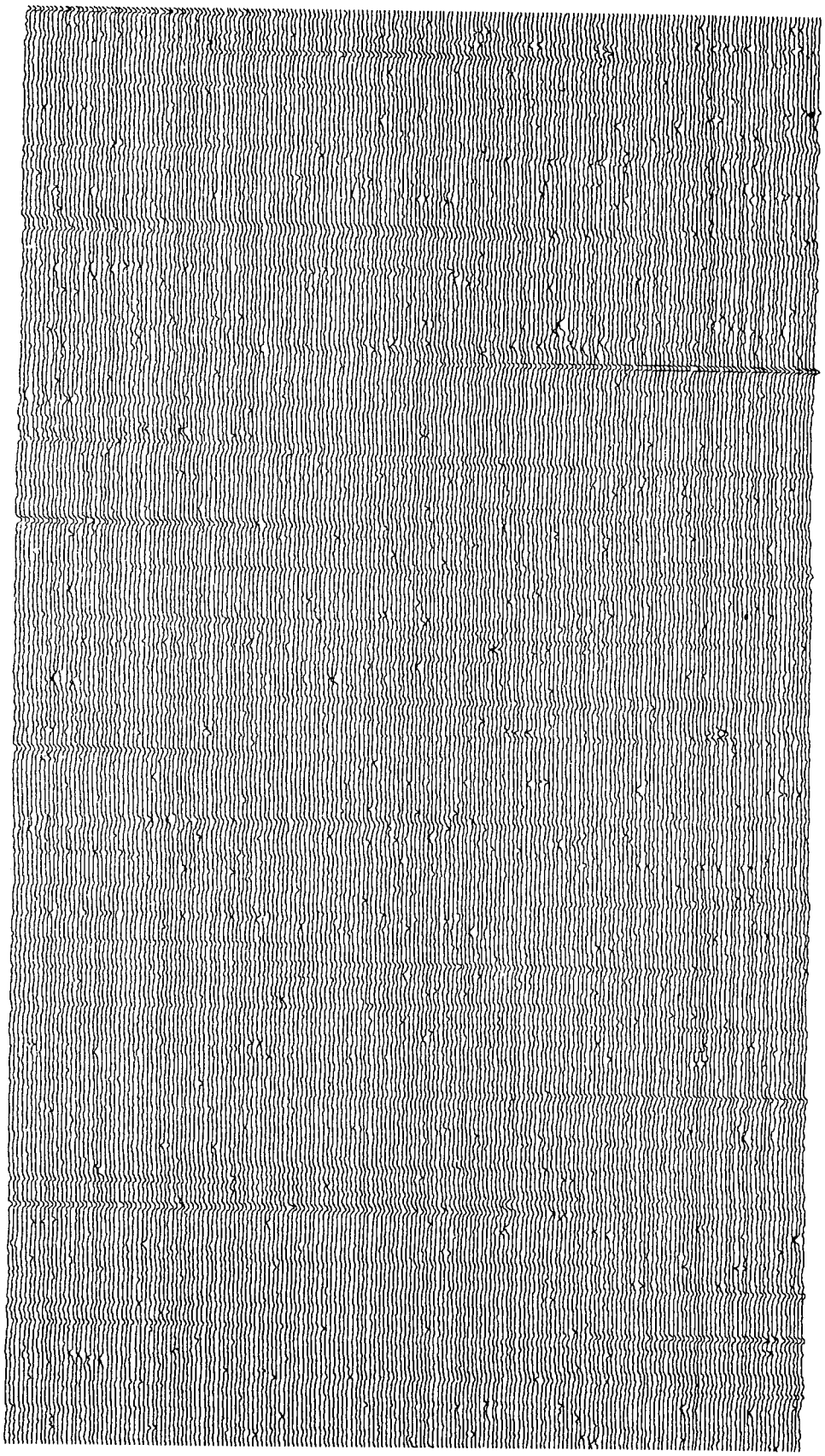
FIG. 10 is a photograph of a printout of a multiple probe, depicting the roughness of the aluminum alloy surface illustrated in FIG. 2, expressed in microinches.
Figure 11:
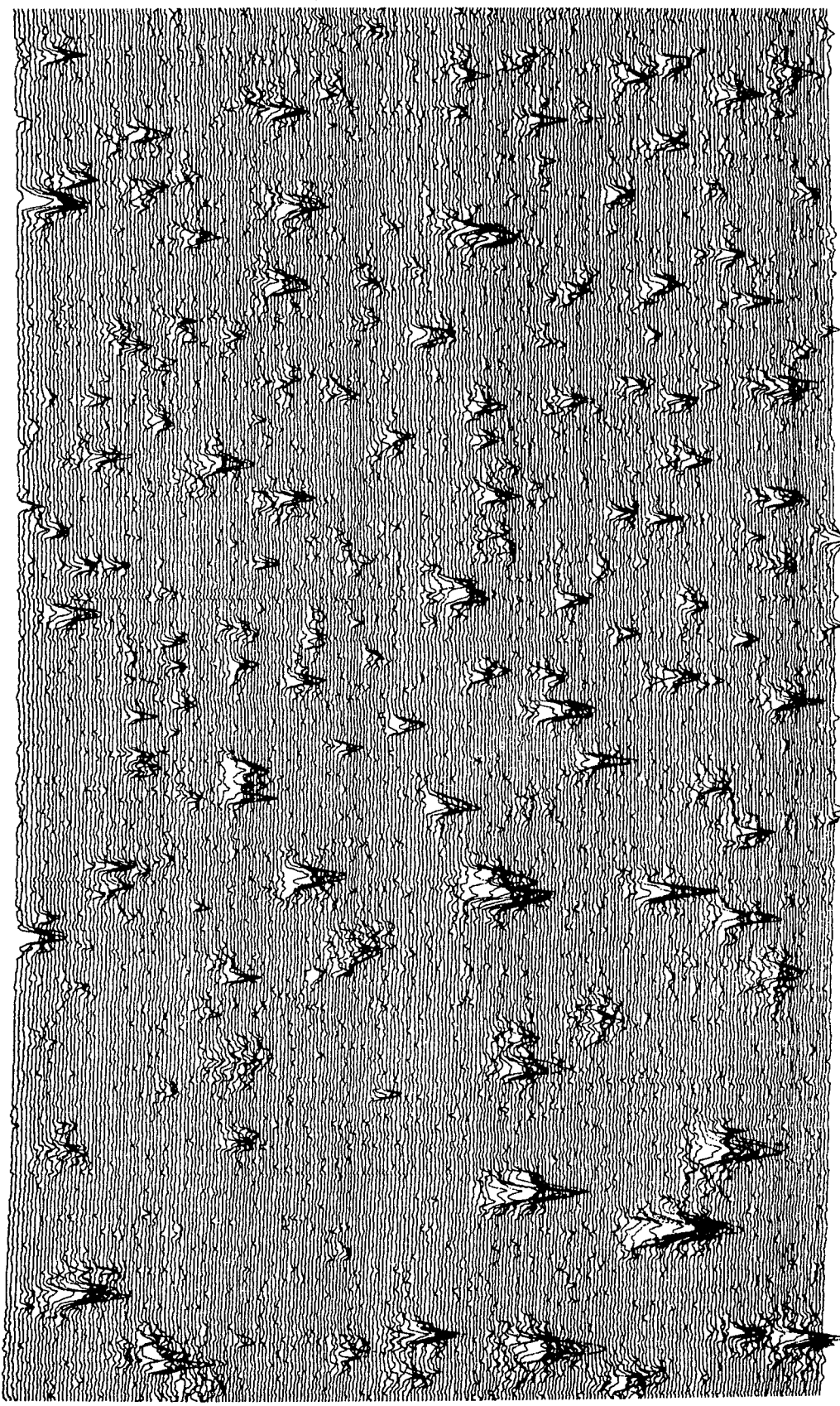
FIG. 11 is a photograph of a printout of a multiple probe, depicting the roughness of the aluminum alloy surface illustrated in FIG. 3, expressed in microinches.
Figure 12:
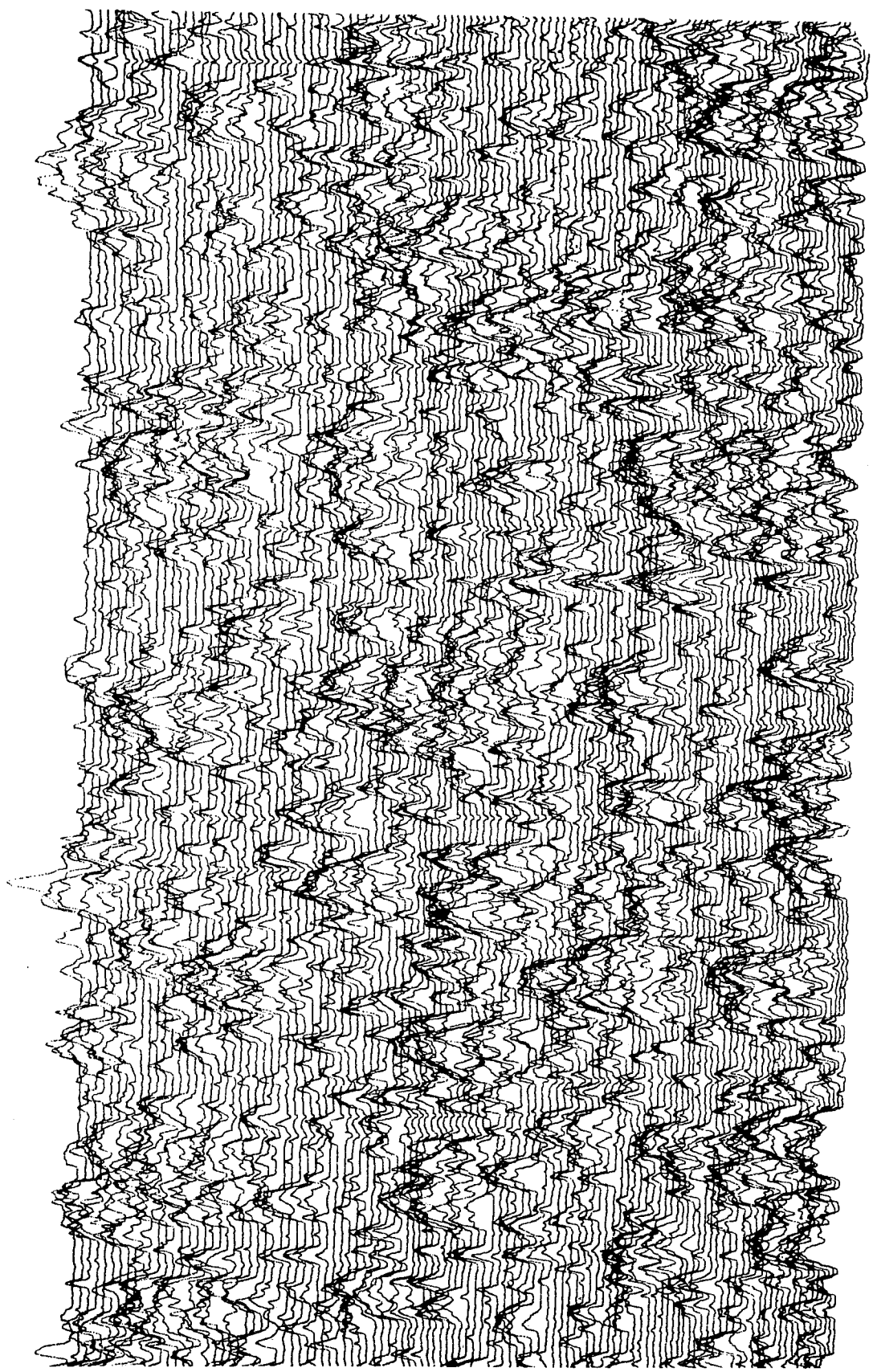
FIG. 12 is a photograph of a printout of a multiple probe, depicting the roughness of the aluminum alloy surface illustrated in FIG. 4, expressed in microinches.

The microtopographical traces of FIGS. 9, 10 also show the remarkably similar characteristic of uniformity of the mildly etched and "as is" surfaces, with the slightly greater roughness of the former being evidenced by the perceptibly greater spacing between lines in FIG. 10 when compared with FIG. 9.

The physical effect of conventional or prior art etching on an aluminum alloy surface can be seen from FIGS. 3, 7, 11 and FIGS. 4, 8, 12. The first grouping of Figures illustrate the effect of etching by exposing an aluminum alloy (1100) surface to HCl vapors at room temperature until tiny droplets or bubbles appeared on the surface. With the surface suspended about three inches above the liquid level at 22° Be' hydrochloric acid, the exposure time was about one minute.

The second grouping of Figures illustrate the effect of etching by exposing an aluminum alloy (1100) surface to HCl vapors generated by hydrochloric acid heated to 140° F. (per U.S. Pat. No. 2,856,333, supra) until tiny droplets or bubbles appeared on the surface. With the surface suspended about two inches above 22° Be' hydrochloric acid heated to 140° F., the exposure time was about 30 seconds.

Both the severity and non-uniformity of pitting is amply evident from FIGS. 3, 7, 11 and 4, 8, 12.

The traces of FIGS. 5–8 were prepared with a Surfanalyzer 150 using a universal probe model 21-3100-00, manufactured by Gould, Inc., Gaging & Control Division, 4601 Arden Drive, El Monte, Calif.

The traces of FIGS. 9–12 were prepared with a *Micro-Topographer* Mt-200 manufactured by Gould, Inc., Measurement Systems Division, 4601 arden Drive, El Monte, Calif.

According to the preferred embodiment, the copper plate is electrocathodically effected in two steps, the first of which deposits copper from a standard pyrophosphate solution, and the second, from a copper sulfate solution. The copper sulfate plating solution preferably contains nitrate ions to produce a nodularized copper surface which promotes better anchorage between the copper foil and a resinous support to which the foil is laminated in the formation of a printed circuit board. Reference may be had to pending application, Ser. No. 576,191, filed May 9, 1975 and entitled "Method of Nodularizing a Metal Surface" for a full disclosure of suitable nitrate-modified copper sulfate plating solutions and plating conditions which may be used in the practice in this step.

The foregoing procedure will result in relatively high peel strengths between the aluminum alloy substrate and the copper foil on the order of 6 to 8 lbs./in., after lamination to a resinous substrate under heat and pressure.

The metal composite thus formed may then be laminated to a suitable resinous support, such as any commercially available FR4 epoxy/glass resinous material.

Where a lower peel strength between the aluminum alloy substrate and the copper foil is desired, that is, one which can be overcome by hand, the metal composite is further treated with an overplate of either zinc or indium on the copper foil. The zinc plate may be deposited from a conventional zinc sulfate plating solution, and the indium plate may be deposited from a fluoborate plating solution. The resulting peel strengths are on the order of 0.3 to 2.0 lbs./in.

In general, satisfactory results are achieved where the total thickness of copper plate is within the range of from about 0.1 to about 0.4 mils. Preferably, however, the pyrophosphate copper plate is deposited to a thickness of about 0.1 mil, the copper sulfate plate is deposited to a thickness of about 0.2 mils. The overplate of zinc or indium where used is deposited to a thickness within the range of about 10 to about 25 microinches.

EXAMPLE I

A strip of aluminum alloy 1100 was immersed in a 2 percent sodium hydroxide etchant solution for two minutes, and thereafter rinsed with tap water.

The etched aluminum alloy was then desmutted by immersion in 30 percent by volume nitric acid for two minutes, and thereafter rinsed with tap water.

The etched and desmutted aluminum alloy substrate was then plated with 0.1 mil copper using a standard pyrophosphate copper bath operated at a current density of 50 amps/ft$^2$ for two minutes at a pH within the range of from about 8 to about 8.5, and a bath temperature of about 60° C. This was followed by a water rinse.

Thereafter, the copper plated aluminum alloy substrate was further electroplated with a 0.2 mil copper layer using an electrolyte having a composition falling within the following ranges:

20–48 g/l copper as copper sulfate pentahydrate
50–60 g/l sulfuric acid
18–22 g/l nitrate as ammonium nitrate.

The cell was operated at a current density of 100 amps/ft$^2$ with a contact time of two minutes, and a bath temperature within the range of 24° to 28° C. The copper plated aluminum alloy was then rinsed and dried. A visual inspection of the copper foil revealed that it was uniformly adhered to the aluminum alloy substrate and free of blisters, pin holes and other irregularities.

The copper plated aluminum alloy was then laminated to a commercially available FR4 epoxy/glass resinous material at a temperature of 350° C., a pressure of 1000 psi for 25 minutes.

The aluminum alloy substrate was then removed. The peel strength between the copper foil and aluminum substrate measured within the range of from about 6 to about 8 lbs./in.

EXAMPLE II

The procedure of Example I was repeated except that following the deposition of copper from the nitrate ionmodified copper sulfate plating solution, a plate of zinc measuring 10 to 20 microinches in thickness was deposited from a plating solution comprising:

310 g/l zinc sulfate
27 g/l aluminum sulfate
22 g/l sodium sulfate.

The plating was conducted at a current density of 26 amps/ft$^2$ with the plating bath at room temperature.

Following lamination as described in Example I, the aluminum alloy substrate was removed from the copper foil and the peel strength measured. Values in the range of from about 0.5 to about 2.0 lbs./in. were recorded.

Comparing the data of Examples I and II, it will be seen that the use of an aluminum alloy 1100 produced a uniformly adhering copper plate with a copper to aluminum peel strength within the range of from about 6 to about 8 lbs./in. The addition of a zinc overplate to the copper foil had no adverse impact on the resin to copper peel strength, nor on the uniformity of the adhesion of the copper to the aluminum alloy, but did very significantly reduce the peel strength at the copper-aluminum interface.

EXAMPLE III

The procedure in Example II was repeated except that a standard indium fluoborate plating solution was substituted for the zinc sulfate plating solution. Here the peel strength between the copper foil and aluminum substrate was measured at values within the range of from about 0.6 to about 0.7 lbs./in. Again, the copper foil was uniformly deposited on the aluminum alloy substrate, and the indium layer had no adverse affect on the peel strength at the copper-resin interface, which again measured within the range of from about 8.8 to about 9.8 lbs./in.

EXAMPLES IV THROUGH VI

The procedure described in Example II was repeated except that the zinc sulfate plating solution was replaced successively by a standard nickel sulfate plating solution, a standard cobalt sulfate plating solution, and a standard stannate plating solution. These treatments produced, respectively, nickel, colbalt, and tin overplates on the copper foil.

EXAMPLE VII

The procedure described in Example II was repeated except that prior to lamination, the zinc overplate was heated in air at 350° F. for 25 minutes, converting at least a portion of the zinc overplate and the copper foil to brass. The peel strength at the copper-aluminum interface measured within the range of from about 0.5 to about 2 lbs./in., indicating that the conversion to brass had no impact on the overplates ability to reduce the peel strength at the copper-aluminum interface.

EXAMPLE VIII

Attempts to copper plate other aluminum alloys similar in composition to alloy 1100 following the foregoing procedures did not produce satisfactory results. Other alloys which were tried are as follows:

| ALLOY 1145 | |
|---|---|
| Ingredient | Concentration (wt. %) |
| Silicon plus iron | up to .55 |
| Copper | up to 0.05 |
| Manganese | up to 0.05 |
| Aluminum | Balance |

| ALLOY 3003 | |
|---|---|
| Ingredient | Concentration (wt. %) |
| Silicon | up to 0.6 |
| Iron | up to 0.7 |
| Copper | 0.05 to 0.20 |
| Manganese | 1.0 to 1.5 |
| Zinc | up to 0.10 |
| Aluminum | Balance |

Alloy 1145 produced a porous plate, and alloy 3003 produced blistering.

EXAMPLE IX

The procedure described in Example I was repeated, except that the aluminum alloy was etched in accordance with the teachings of U.S. Pat. No. 2,856,333 (supra) as follows:

A beaker of 22° Be' hydrochloric acid was heated to 140° F., and the strip of aluminum was placed in the HCl fumes rising from the acid, at a distance of about two inches above the liquid level. After the formation of tiny droplets or bubbles appeared (about 30 seconds) the aluminum was removed and thoroughly rinsed.

Following copper plating and laminating as described in Example I, an attempt was made to measure the peel strength of the copper-aluminum interface. A force of about 14.6–14.8 lbs./in. width of copper foil was applied at which point the bond between the copper foil and the resinous material failed. This indicated that bond between the copper foil and the aluminum alloy was greater than 14.6–14.8 lbs./in. width of copper foil.

While the invention has been described with reference to certain specific embodiments, neither the embodiments illustrated nor the terminology employed in describing them is intended to be limiting; rather it is intended that the invention be limited by the scope of the appended claims.

Having thus described our invention, we claim:

1. A method of forming a metal composite for use as a component of a laminate for printed circuits comprising:
    (a) mildly and uniformly etching an aluminum alloy surface with an aqueous solution of an alkaline etchant, said alloy consisting of at least about 99 wt. % aluminum, up to about 1.00 wt % silicon plus iron, from about 0.05 to about 0.20 wt. % copper, up to about 0.05 wt. % manganese and up to about 0.10 wt. % zinc,
    (b) electrocathodically depositing directly on said etched surface a foil of copper to a thickness within the range of about 0.1 to about 0.4 mils, the uniformity of etching performed in step (a) being characterized by the copper foil being uniformly adhered to the aluminum alloy surface, and (c) electrocathodically overplating the exposed face of the copper foil with a coating of a material selected from the group consisting of zinc and indium, said coating having a thickness within the range of about 10 to about 25 micro-inches and providing a peel strength between the copper foil and said aluminum alloy surface with a value within the range of about 0.3 to about 2 lbs./in. of width of copper foil, after bonding the overplated face of the copper foil by heat and pressure to a resinous substrate.

2. A method of forming a metal composite for use as a component of a laminate for printed circuits comprising:

(a) mildly and uniformly etching an aluminum alloy surface with an aqueous solution of an alkaline etchant said alloy consisting of at least about 99 wt. % aluminum, up to about 1.00 wt. % silicon plus iron, from about 0.05 to about 0.20 wt. % copper, up to about 0.05 wt. % manganese and up to about 0.10 wt. % zinc, (b) rinsing the etched surface with water to remove the etchant, (c) desmutting the surface by contacting the same with an agent selected from the group consisting of aqueous solutions of nitric and sulfuric acids, (d) rinsing the desmutted surface with water to remove said etchant, and (e) electrocathodically depositing directly on said etched and desmutted surface a foil of copper to a thickness within the range of about 0.1 to about 0.4 mils, the uniformity of etching performed in step (a) being characterized by the copper foil being uniformly adhered to the aluminum alloy surface, and (f) electrocathodically overplating the exposed face of the copper foil with a coating of a material selected from the group consisting of zinc and indium, said coating having a thickness within the range of about 10 to about 25 microinches and providing a peel strength between the copper foil and said aluminum alloy surface with a value within the range of about 0.3 to about 2 lbs./in. of width of copper foil, after bonding the overplated face of the copper foil by heat and pressure to a resinous substrate.

* * * * *